(12) United States Patent
Ames et al.

(10) Patent No.: US 6,237,393 B1
(45) Date of Patent: May 29, 2001

(54) WAFER CENTER ALIGNMENT DEVICE AND METHOD OF WAFER ALIGNMENT

(75) Inventors: Dennis B. Ames, Danbury, CT (US); Michael J. Schade, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/363,740

(22) Filed: Jul. 30, 1999

(51) Int. Cl.$^7$ ................................................. G01B 11/00
(52) U.S. Cl. ............................................................. 73/1.79
(58) Field of Search ..................................... 73/1.01, 1.79, 73/1.81; 901/3, 4, 5

(56) References Cited

U.S. PATENT DOCUMENTS 5,438,418 * 8/1995 Fukui et al. .
5,981,966 * 11/1999 Honma ...................................... 901/3

* cited by examiner

*Primary Examiner*—Robert Raevis
(74) *Attorney, Agent, or Firm*—Ratner & Prestia; Tiffany L. Townsend, Esq.

(57) ABSTRACT

A calibration wafer for precisely aligning a wafer-handling system that processes a plurality of product wafers. The calibration wafer has radial and thickness dimensions and tolerances equivalent to those of the product wafers and further comprises a first center marker adapted for alignment with a second center marker external to the calibration wafer. The calibration wafer may be a component of a wafer center alignment device for precisely aligning a wafer-handling system in a calibration location in relation to a wafer-processing tool, the device further comprising an alignment jig adapted to be repeatably mounted on the tool and on which the second center marker is located. The calibration wafer is adapted to be positioned so that the first center marker aligns with the second center marker. The first and second markers may be visual alignment devices, in which case the calibration wafer may be at least partially transparent, or the markers may be mechanical alignment devices or a transmitter and receiver. Methods for aligning a wafer-handling system are also provided.

31 Claims, 9 Drawing Sheets

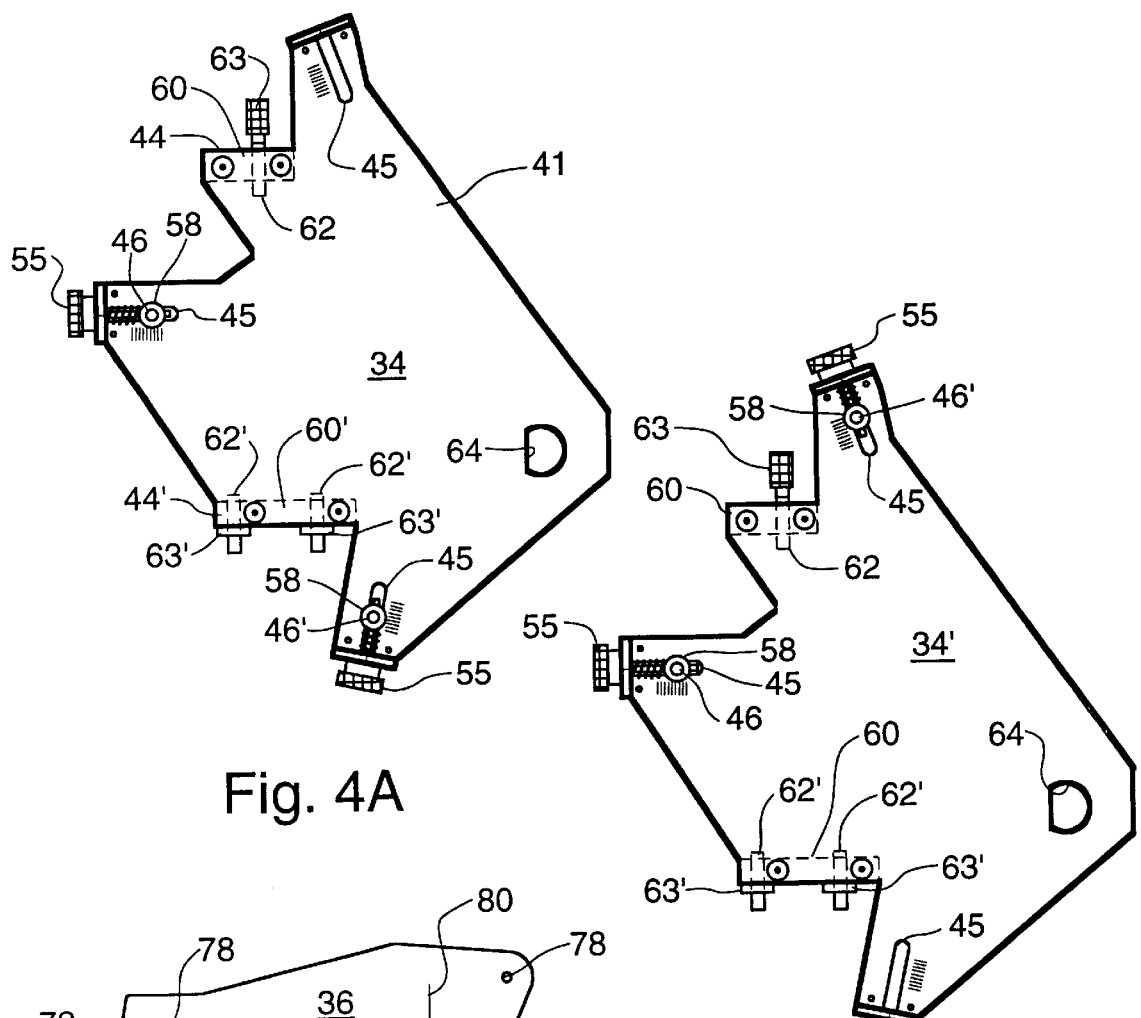
Fig. 4A
Fig. 6A
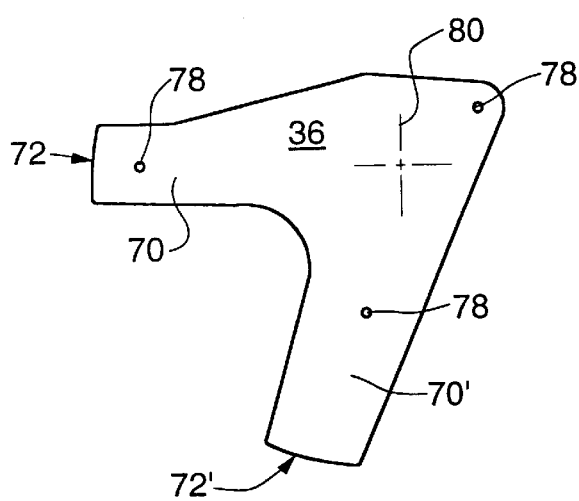
Fig. 4B
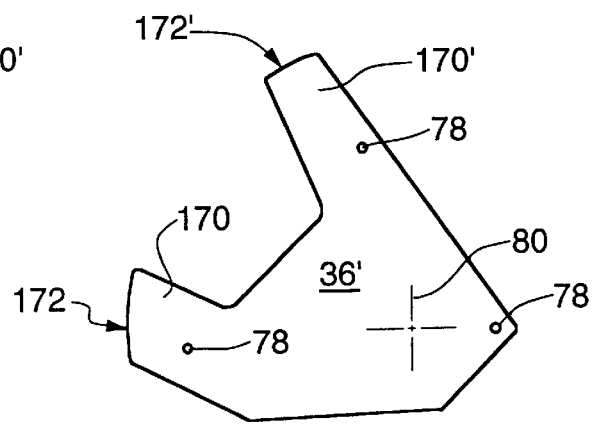
Fig. 6B

WAFER CENTER ALIGNMENT DEVICE AND METHOD OF WAFER ALIGNMENT

TECHNICAL FIELD

The present invention relates generally to semiconductor manufacture and, more specifically, to alignment of wafers within lithography tools.

BACKGROUND OF THE INVENTION

In the manufacture of semiconductors, circuitry patterns are commonly transferred by lithography to multiple chips on a single semiconductor wafer. The lithography process generally comprises coating the wafer with a photoresist, exposing the photoresist in a pattern corresponding to the circuitry pattern desired, and developing the wafer to remove the photoresist in the exposed areas. Further processing, such as etching steps, may then follow using the patterned photoresist as a mask.

Because of the submicron-level resolution of the circuitry patterns and the constant drive to produce quality products with zero defects, the importance of aligning semiconductor wafers properly on the lithography tools is increasing. In an exemplary lithography configuration 200, as shown schematically in FIG. 8, each semiconductor wafer 202 is handled by a track system 204 that performs the step of coating the wafer 202 with photoresist and then delivers the coated wafer 202 to a lithography tool 206 at a pickup-dismount location 210. Track system 204 typically uses a robot 212 to transfer wafer 202. After wafer 202 is delivered by robot 212 of track system 204, a robotic component of lithography tool 206, such as a stepper robot 214, typically picks up the wafer 202 and takes it to a pre-aligner 216, where the center of the wafer 202 is determined. From the pre-aligner 216, the wafer 202 travels to the exposure chuck (not shown), where the wafer 202 is precisely positioned for alignment and exposure.

The transfer of wafer 202 from one robot to the other at pickup-dismount location 210 is critical, because the wafer 202 must be perfectly aligned at each step of the process. If the robot 212 of the track system 204 somehow becomes misaligned with the stepper robot 214 of the lithography tool 206, then the placement of wafer 202 within the capture range of pre-aligner 216 (a range, for example a ±4 mm x±4 mm window, within which the wafer center must be located for the wafer 202 to be further processed correctly) may be out-of-tolerance, potentially affecting final product quality. Therefore, the alignment of the robots 212, 214 with one other at pickup-dismount location 210 must be periodically re-calibrated.

Wafer-handling robots are generally of two types: edge-handling robots that handle the wafer from the edges, and center-handling robots that handle the wafer from the center. Stepper robots are almost exclusively center-handling robots, whereas track robots may generally be edge-handling or center-handling robots. Edge-handling robots are typically aligned to a wafer center position, whereas center-handling robots are typically aligned to a wafer edge position.

Referring now to FIG. 1, there is shown a tilt-plate assembly 10. Tilt-plate assembly 10 is mounted to the lithography tool (not shown in FIG. 1) by placement of alignment pegs 20 in corresponding indents (not shown) in the tool. Tilt-plate assembly 10 has an upper side edge 66 and a lower side edge 68. Tilt-plate assembly 10 is typically held in place by a tensioned cross-piece 22 inserted through a hole 24 and positioned crosswise within an indent 26. The track system robot (not shown) typically places the wafer (not shown) on tilt-plate assembly 10 with its underside touching only the tooling balls 12 on the tooling arms 14 and the tooling post 16 that extend from the tilt-plate assembly 10.

The lithography tool robot (not show if then picks up the wafer from tilt-plate assembly 10 for further processing. A known method of calibrating the alignment of the respective robots with respect to wafer placement on the tilt-plate assembly 10 is to draw an arc on each robotic arm in the position where the edge of the wafer should be located when handled by that robot. Misalignment of the wafer edge with respect to the arc drawn on the robot arm indicates misalignment of the robots. To recalibrate, the robot positions are then adjusted by trial and error until the arcs and edges are aligned correctly. This process is time-consuming and not readily repeatable because there is no fixed reference point for both robots.

Thus, there is a need in the industry for a wafer alignment jig and a center alignment device for use with the wafer alignment jig that allow fast, repeatable calibration of the alignment of wafer-handling systems with one another. In particular, there is a need for a jig that may be used to align edge-handling wafer-handling systems and for aligning both a center-handling wafer-handling system and an edge-handling wafer-handling system to one another.

SUMMARY OF THE INVENTION

To meet these and other needs, and in view of its purposes, the present invention provides a calibration wafer for alignment of a wafer-handling system adapted to process a plurality of product wafers. The calibration wafer has radial and thickness dimensions and tolerances equivalent to the product wafers and further comprises a first center marker adapted for alignment with a second center marker external to the calibration wafer. The calibration wafer may comprise at least a portion that is transparent. The first center marker may be a visual alignment device, such as an alignment pin that may be mounted within a bushing adapted to enable movement of the alignment pin relative to the bushing along a longitudinal axis of the alignment pin.

The present invention further comprises a wafer center alignment device for precisely aligning a wafer-handling system in a calibration location with respect to a wafer-processing tool. The calibration location may be, for example, a wafer dismount location of a first wafer-handling system that is a wafer pickup location of a second wafer-handling system. The wafer center alignment device comprises an alignment jig adapted to be repeatably mounted on the tool and having a second center marker, and a calibration wafer having a first center marker. The calibration wafer is adapted to be positioned above the alignment jig with the first center marker in alignment with the second center marker. The jig may further comprise an edge-to-center locator having the second center marker on the edge-to-center locator and adapted to be mounted on the alignment fixture. The second center marker, when located on the edge-to-center locator, marks the precise center of the calibration location when the edge-to-center locator peripheral edge is positioned in contact with one or more edge stops on the alignment fixture.

The first and second center markers may be visual alignment devices, such as an alignment pin and cross hairs, mechanical alignment devices, or a transmitter and receiver. If the markers are a transmitter and receiver, the receiver may be connected to at least one of the wafer-handling systems and adapted to transmit a calibration signal to the wafer-handling system.

The present invention also comprises a method of aligning an interactive location of a wafer-handling system on a wafer-processing tool. The method comprises first mounting a pre-calibrated jig to the tool at the interactive location, the jig comprising a second center marker. Next, a calibration wafer is placed at the calibration location by the wafer-handling system, the calibration wafer having a first center marker. The alignment of the first center marker with the second center marker is evaluated and the wafer-handling system is adjusted accordingly. The wafer placement, evaluation, and adjustment steps are repeated as necessary until the wafer is placed in a position where the second center marker and the first center marker are aligned within a predetermined tolerance. The jig may further comprise an alignment fixture having one or more edge stops and an edge-to-center locator having a peripheral edge, in which case the method comprises positioning the edge-to-center locator peripheral edge in contact with the alignment fixture edge stops such that the second center marker identifies the precise center of the calibration location.

When the calibration location is a wafer pickup-dismount location for more than one wafer-handling system, the method comprises carrying out the above steps for at least one wafer-handling system and performing either the above steps or the following alternate steps for additional wafer-handling systems until all the additional wafer-handling systems have been calibrated. The alternate steps comprise placing a wafer at the calibration location with the additional wafer-handling system to be calibrated, evaluating alignment of the wafer with the alignment fixture by evaluating contact of a peripheral edge of the wafer with the one or more edge stops, adjusting the wafer-handling system; and repeating the above steps as necessary until the wafer is placed in a position where the wafer peripheral edge and the one or more edge stops are aligned within a predetermined tolerance.

The method may further comprise pre-calibrating the jig by mounting the jig to the tool at the calibration location; placing a wafer at the calibration location with the wafer-handling system, the wafer having been pre-aligned to the wafer-handling system by a sequentially adjacent processing tool; adjusting the one or more alignment fixture edge stops to be positioned in peripheral contact with the wafer; and fixing the edge stop or stops in that position.

It is to be understood that both the foregoing general description and the following detailed description are exemplary, but are not restrictive, of the invention.

BRIEF DESCRIPTION OF DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 4A is an isolated schematic illustration plan view of the alignment fixture of FIG. 2;

FIG. 4B is an isolated schematic illustration plan view of the edge-to-center locator of FIG. 2;

FIG. 6A is an isolated schematic illustration plan view of the alignment fixture of FIG. 5;

FIG. 6B is an isolated schematic illustration plan view of the edge-to-center locator of FIG. 5;

DETAILED DESCRIPTION OF INVENTION

Figure 1:
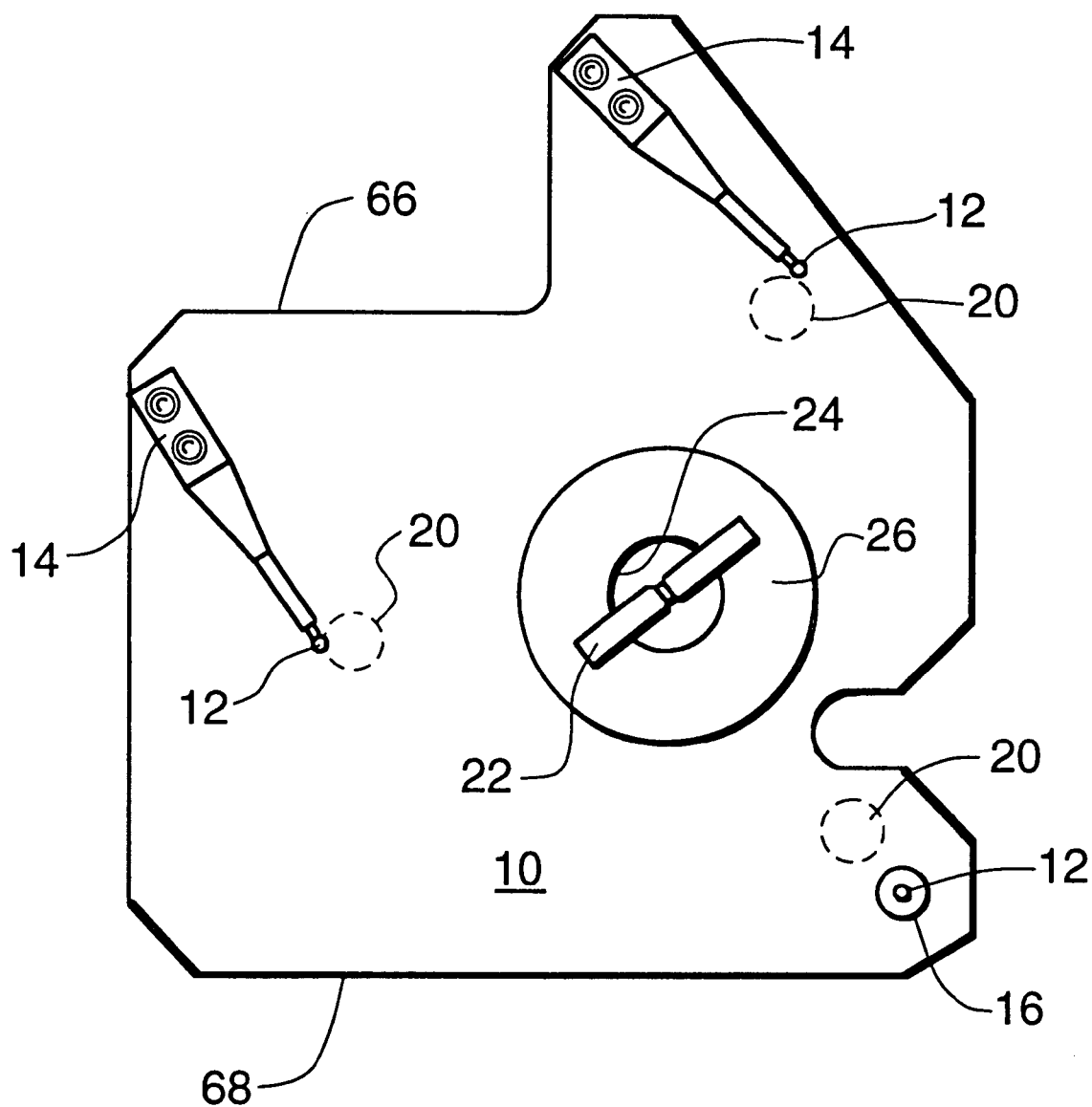
FIG. 1 is schematic illustration plan view of a tilt-plate assembly known in the art.

Referring now to the drawing, in which like reference numbers refer to like elements throughout, FIGS. 2, 3A, 3B, 4A, and 4B show schematic illustrations of an exemplary, assembled, alignment jig 30 that is a component of the center alignment device of the present invention. Such a jig 30 having the features described below provides a repeatable, fixed calibration point, but can be removed after calibration so that it is not in the way of wafer movement during normal operation. Jig 30 is the subject of a co-pending patent application titled "WAFER ALIGNMENT JIG AND ALIGNMENT METHOD FOR WAFER-HANDLING SYSTEMS," filed contemporaneously with the present application on behalf of co-inventors Dennis Ames and John Bacich and incorporated in this application by reference.

Figure 2:
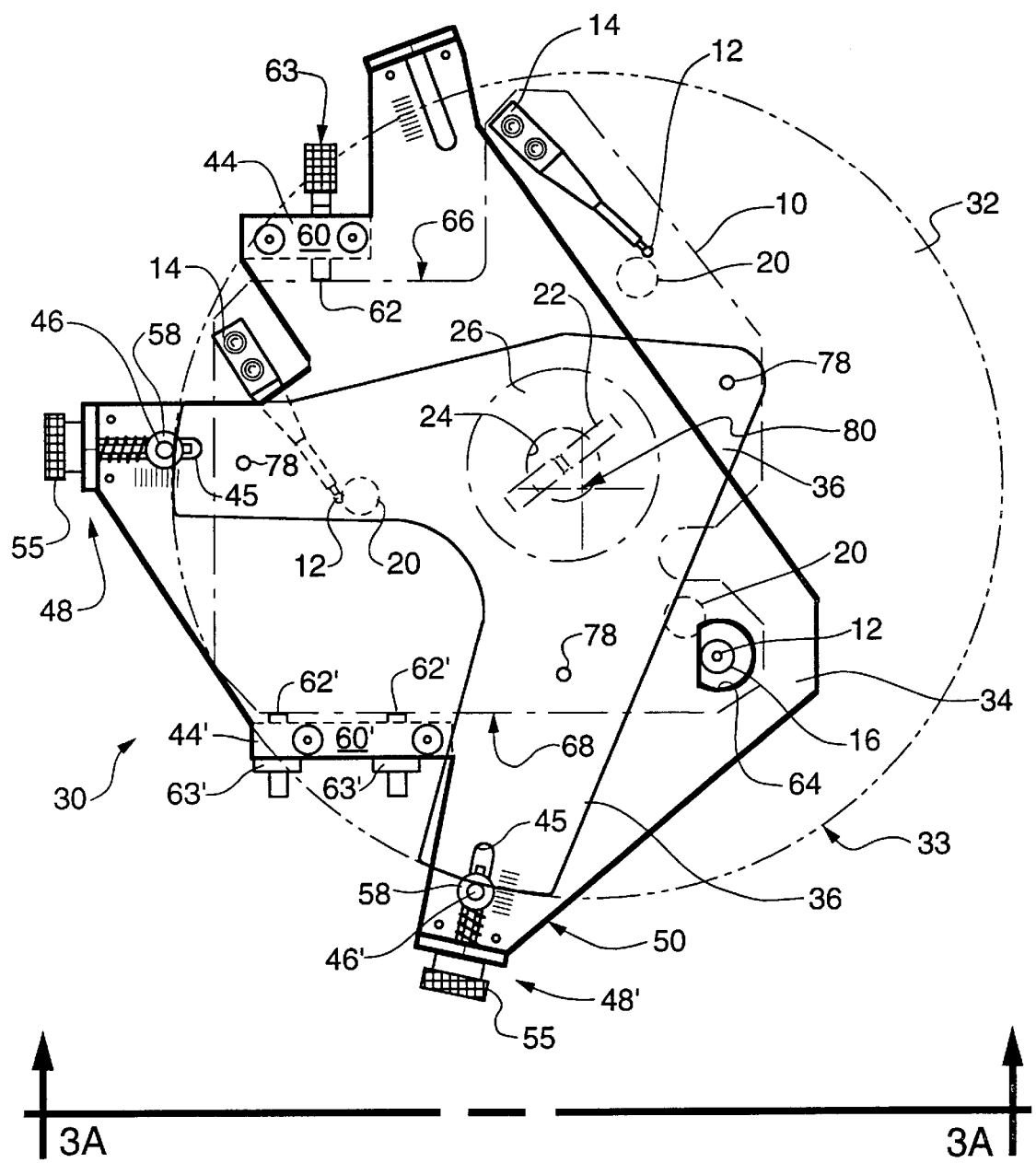
FIG. 2 is a schematic illustration plan view of an exemplary assembled jig of the present invention mounted on the tilt-plate assembly of FIG. 1 and having a wafer mounted on the jig, each element depicted transparently to show the alignment of elements.

FIG. 2 shows exemplary jig 30 mounted on tilt-plate assembly 10 with a wafer 32 mounted on the jig. Wafer 32 has a peripheral edge 33. Alignment jig 30 as shown in FIG. 2 comprises an alignment fixture 34 and an edge-to-center locator 36, each shown in an isolated illustration in FIGS. 4A and 4B, respectively. To show the alignment of elements over tilt-plate assembly 10 and with respect to each other, wafer 32, alignment fixture 34, and edge-to-center locator 36 are depicted transparently in FIG. 2.

Figure 3A:
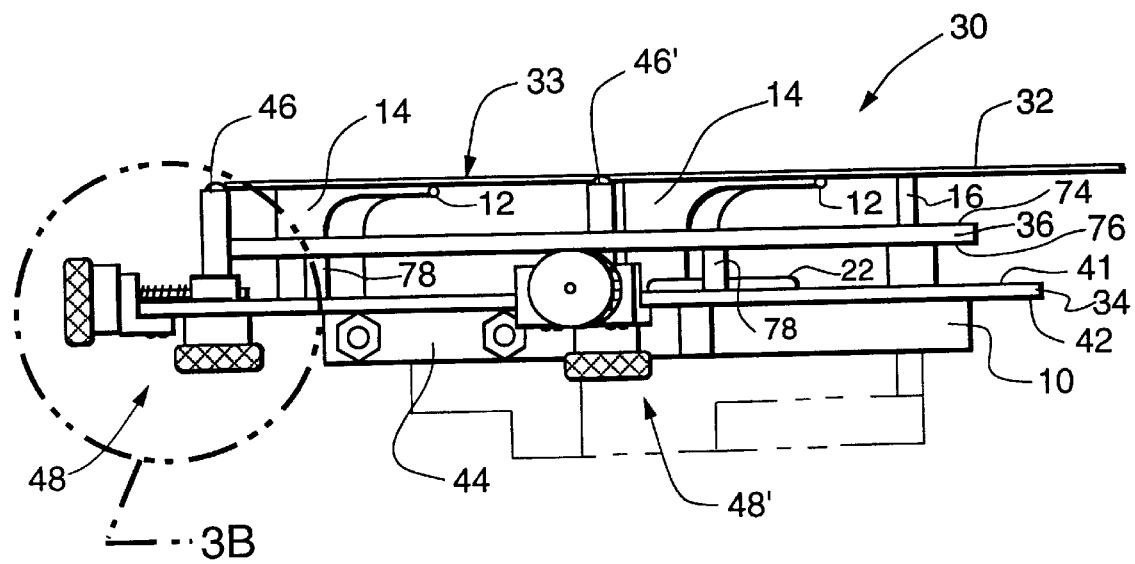
FIG. 3A is a schematic illustration side view of the assembled jig taken along the line 3A—3A of FIG. 2.
Figure 3B:
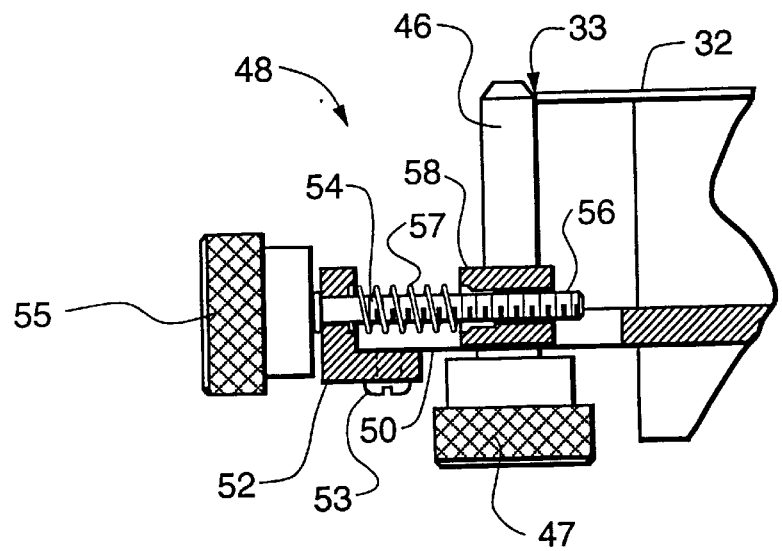
FIG. 3B is a schematic illustration detailed side view of the clamp assembly encircled in FIG. 3A.

Alignment fixture 34 has a top side 41 and an underside 42, as shown in FIG. 3A. Two clamp fixtures 44 and 44' are mounted on underside 42. Two edge locator pin assemblies 48 and 48' attach to the edge 50 of alignment fixture 34 with an L-bracket 52 held in place by a set screw 53, as shown in FIG. 3B. Edge locator pin assemblies 48 and 48' are identical, and each comprises an edge locator pin 46 and 46', respectively. Each edge locator pin 46 and 46' originates from a knob 47 on underside 42 of alignment fixture 34, extends through a slot 45, and projects vertically from top side 41. An adjustment screw 54 has external threads on its inner end 56 that mate with internal threads in the base 58 of edge locator pin 46 so that, as knob 55 is turned, edge locator pin 46 and base 58 are moved toward or away from knob 55 as desired. The spring 57 around screw 54 between base 58 and L-bracket 52 enables smooth adjustment by preventing backlash. Once edge locator pin 46 has been placed in the desired position, knob 47 can be tightened against underside 42 of alignment fixture 34 to fix the position of edge locator pin 46.

Clamp fixtures 44 and 44' comprise blocks 60 and 60' having protruding stops 62 and 62', respectively. As shown in FIGS. 2 and 4A, clamp fixture 44 comprises a single stop 62 protruding through one end of block 60 and having a knob 63 on the opposite end for manual adjustment of the distance the stop 62 protrudes. Clamp fixture 44' has two stops 62' protruding through one end of block 60', each stop 62' having on the opposite end a nut 63' for fixing the protrusion distance of the stop 62'.

Alignment fixture 34 further comprises a D-shaped hole 64. Thus, alignment fixture 34 has essentially a three-point alignment system allowing it to be repeatably placed onto tilt-plate assembly 10. Two of the three points are where each stop 62' of clamp fixture 44' contacts the lower side edge 68 of the tilt-plate assembly 10, and the third point is where post 16 contacts the edge of D-shaped hole 64 through which the post 16 extends. Stop 62 on clamp fixture 44 can be manually adjusted by turning knob 63 until the stop 62 contacts the upper side edge 66 of the tilt-plate assembly 10, thus temporarily affixing alignment fixture 34 to tilt-plate assembly 10 for the duration of the calibration procedure. Thus, with respect to FIG. 2, alignment fixture 34 is held in place on tilt-plate assembly 10 in the up-down direction by stops 62 and 62', and in the left-right direction by post 16 and friction between stops 62, 62' and corresponding edges 66, 68 of the tilt-plate assembly 10. The meandering peripheral outline of alignment fixture 34 allows it to be placed on tilt-plate assembly 10 without interfering with arms 14.

Edge-to-center locator 36 (shown isolated in FIG. 4B) fits atop alignment fixture 34 as shown in FIGS. 2 and 3A, and further comprises edge extensions 70 and 70' each having a peripheral contact edge 72 and 72', respectively. Contact edges 72 and 72' are sectors of a circular disc having the same radius as the standard wafers handled by the handling system. Therefore, when edge-to-center locator 36 is placed atop alignment fixture 34, there is only one precise location where both contact edges 72 and 72' are in simultaneous contact with edge locator pins 46 and 46', respectively.

Edge-to-center locator 36 has a top side 74 and an underside 76. Underside 76 includes a set of spacers 78 to space edge-to-center locator 36 a predetermined distance from alignment fixture 34, as shown in FIG. 3A. A predetermined distance means a reasonably predictable, as opposed to random, distance as fixed by the height of spacers 78. Top side 74 includes a visual alignment device such as cross-hairs 80 that mark the location corresponding to the precise center of wafer 32 when placed with both contact edges 72 and 72' in simultaneous contact with edge locator pins 46 and 46'. Other types of center markers could also be used, some of which are described below, including transmitters or receivers, mechanical alignment devices, or other visual alignment devices such as, for example but not limited to: a hole, a raised bump or cone, or a bulls-eye.

The alignment jig 30 shown in FIG. 2 is an exemplary jig applicable for use with center-handling wafer track systems, in particular those manufactured by Silicon Valley Group, Inc. (SVG) of San Jose, Calif. For edge-handling wafer track systems, such as those made by DNS Electronics (DNS) of Sunnyvale, Calif. and Tokyo Electron America (TEL) of Austin, Tex., however, the location of edge locator pin 46' on jig 30 interferes with the robot motion and is therefore impractical for use.

Figure 5:
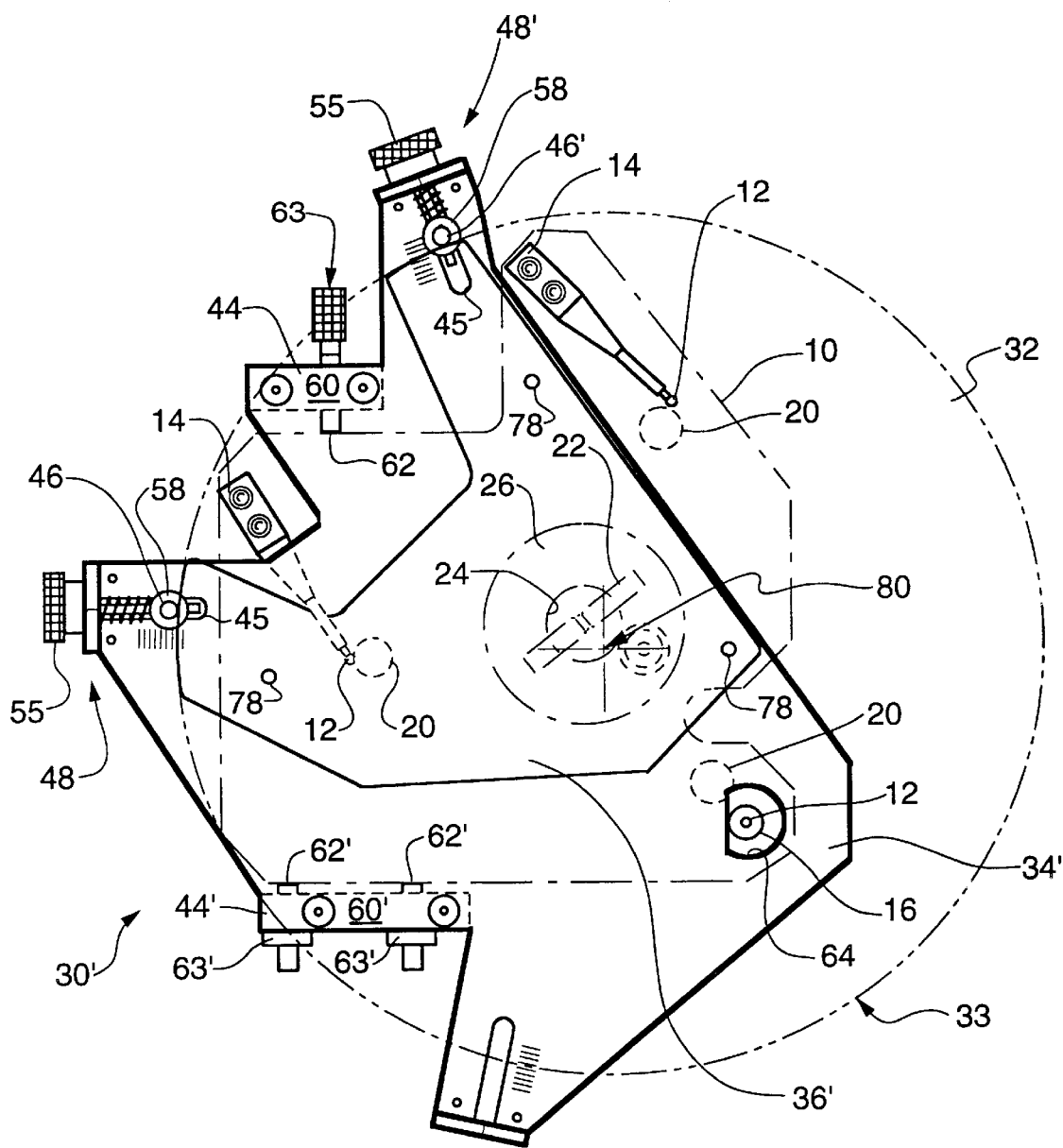
FIG. 5 is a schematic illustration plan view of another exemplary assembled jig of the present invention mounted on the tilt-plate assembly of FIG. 1 and having a wafer mounted on the jig, each element depicted transparently to show the alignment of elements.

Thus, referring now to FIGS. 5, 6A, and 6B there is shown an alignment jig 30' comprising an alignment fixture 34' and an edge-to-center locator 36' compatible with the DNS and TEL edge-handling robot applications. The various components of alignment fixture 34' and edge-to-center locator 36' of jig 30' are the same as for alignment fixture 34 and edge-to-center locator 36, respectively, of jig 30. The primary difference lies in the location of edge locator pin assemblies 48' and the peripheral outline of edge-to-center locator 36'. Thus, edge-to-center locator 36' has edge extensions 170 and 170' and corresponding contact edges 172 and 172' analogous to, but having different geometry than, extensions 70 and 70' and contact edges 72 and 72' of edge-to-center locator 36.

Other alignment jigs may be designed having various geometries and orientations and having corresponding alignment fixtures adapted to fit the corresponding tool and the track systems used with those components. Such a jig may be without a separate edge-to-center locator, but instead may have the center marker as an integral portion of the jig. Likewise, the edge-to-center locator can be adapted to a corresponding alignment fixture and handling system in any geometry to avoid interference with robotic motion or tool components. Furthermore, the alignment fixture may have another type of edge stop or stops in place of the two edge locator pins 46, 46' shown in FIGS. 2, 3A, 3B, 4A, and 6A above, so long as such edge stop or stops provide only one possible location for the edge-to-center locator. For instance, if the geometry of the tool and the robotic handler so allow, a single continuous stop could serve in place of two separate stops located at the endpoints of the continuous stop. Similarly, such a continuous stop could be broken down into more than two discrete stops.

A jig that is a part of the center alignment device of the present invention must be adapted, however, to be repeatably mounted on the corresponding tool and have a center marker that marks the precise center of the interactive location to be calibrated. The center alignment device further comprises a calibration wafer 300, such as is shown in FIGS. 9A and 9B.

Figure 9A:
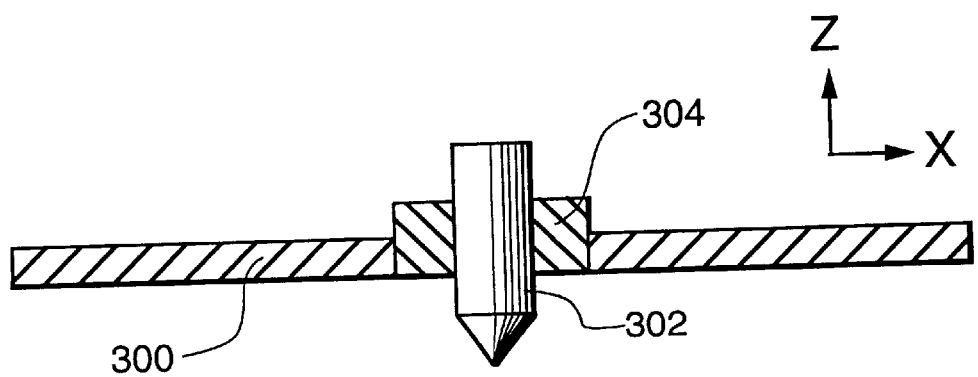
FIGS. 9A and 9B are a partial cross section view and plan view, respectively, of an exemplary calibration wafer of the present invention having an alignment pin.
Figure 9B:
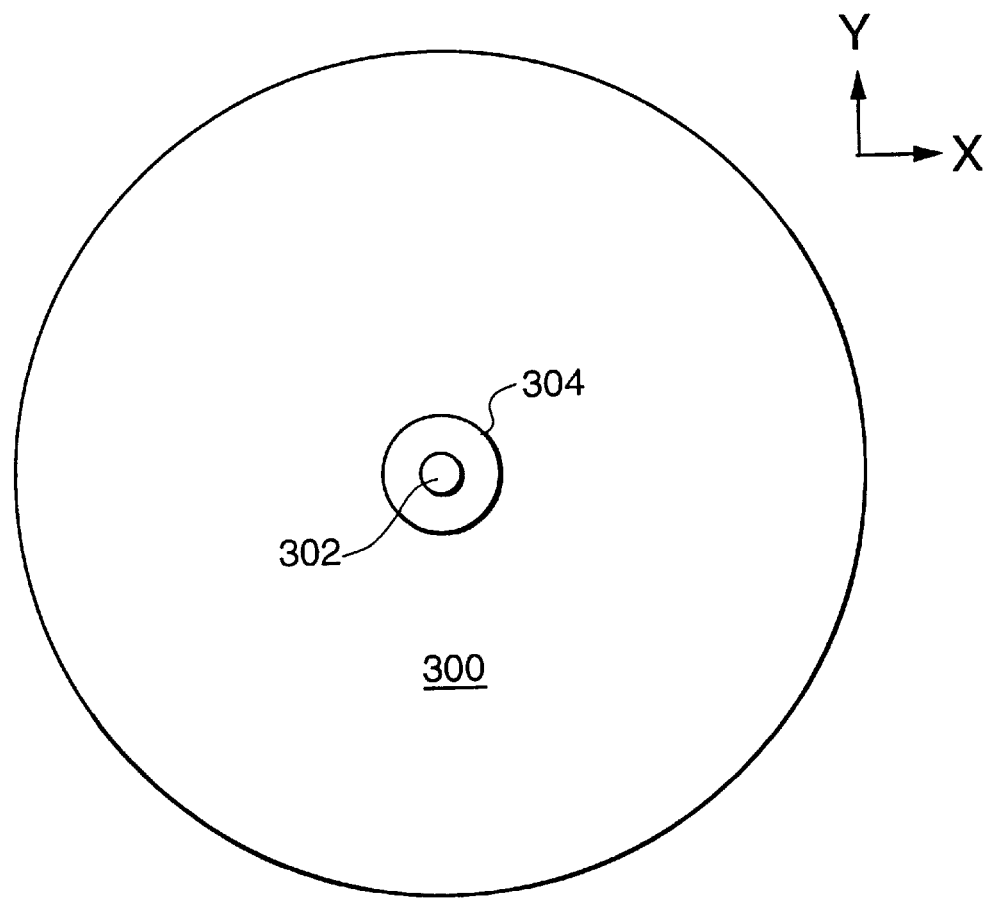

As shown in FIGS. 9A and 9B, calibration wafer 300 comprises a transparent substance, for example a clear plastic or polycarbonate resin such as Lexan® manufactured by the General Electric Company, and is sized to have the same dimensions and same tolerances in both thickness and diameter as the wafers normally processed by the wafer-handling system. Calibration wafer 300 comprises a precisely aligned center marker that may be a visual alignment device such as alignment pin 302, shown mounted in alignment bushing 304 in FIGS. 9A and 9B. Alignment bushing 304 is constructed so that alignment pin 302 may move freely up and down through the bushing along the Z-axis with a minimum amount of play along the X-axis or Y-axis.

Figure 7:
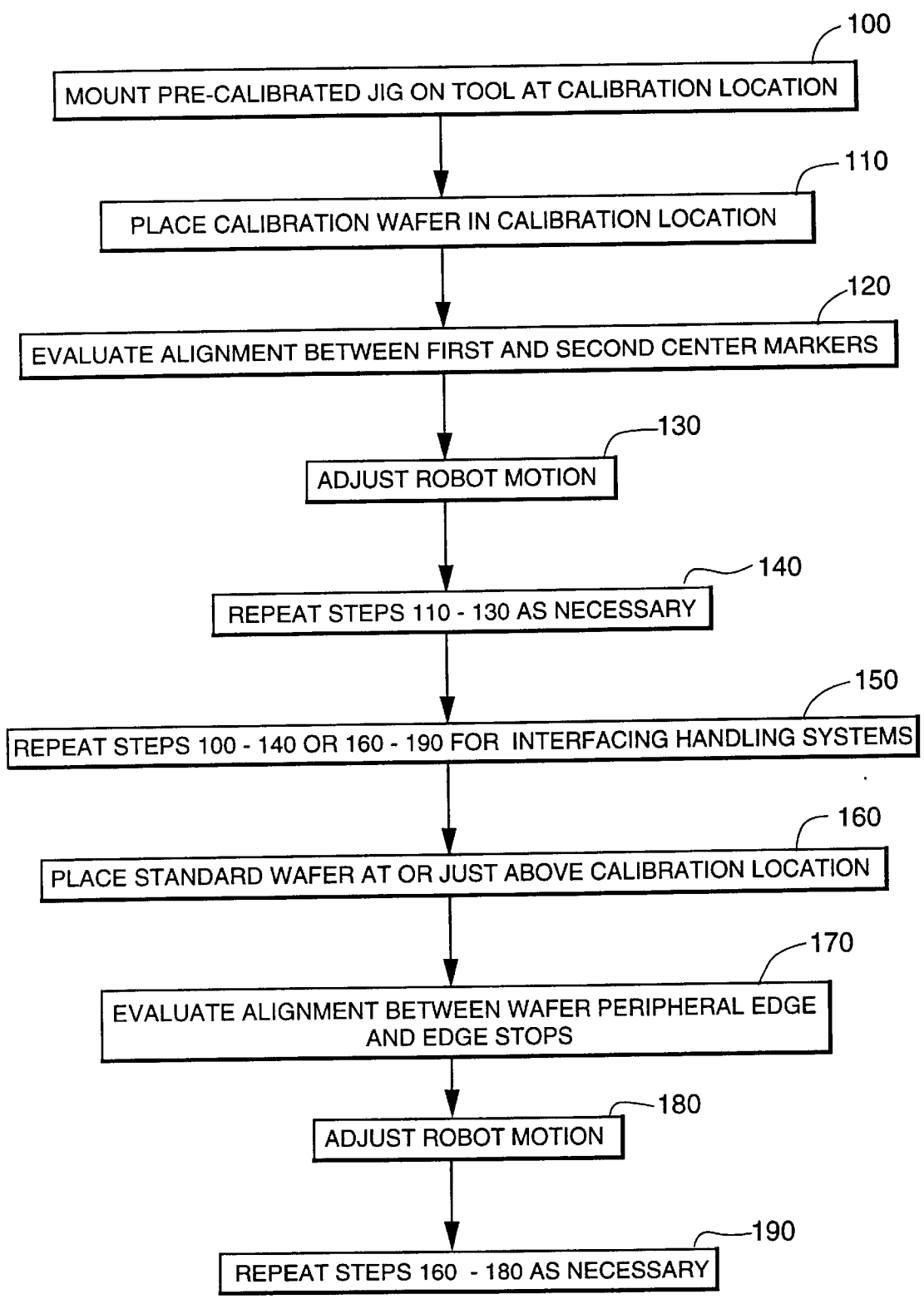
FIG. 7 is flowchart depicting an exemplary method according to the present invention.
Figure 10:
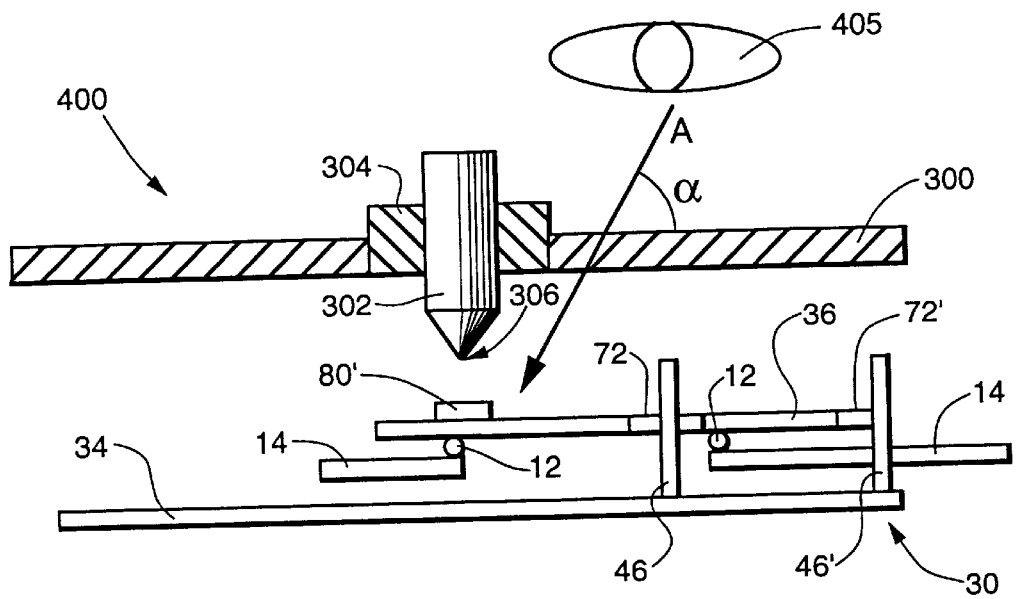
FIG. 10 is a side view of an exemplary center alignment device of the present invention having visual alignment devices, showing the calibration wafer in partial cross section.

The center alignment device of the present invention, such as device 400 shown in FIG. 10, may be used to carry out an exemplary alignment method as shown in FIG. 7. Although described as specifically related to the pickup-dismount locations of the track system and lithography tool in this application, the method is applicable to alignment of any calibration location of a single wafer-handling system, or a pickup-dismount location shared by a plurality of wafer-handling systems. The term "pickup-dismount location" refers to any location that may be a pickup location for one or more wafer-handling systems, a dismount location for one or more wafer-handling systems, or both.

Referring now to the flowchart of FIG. 7 depicting method steps and to FIG. 10 showing exemplary physical relationships among components, in step 100, a pre-calibrated jig 30 is first affixed to a wafer-processing tool (not shown in FIG. 10) at the location to be calibrated (for example, jig 30 is affixed to the tilt-plate assembly 10 as shown in FIG. 2). As shown in FIG. 10, jig 30 comprises alignment fixture 34 affixed to the tool and edge-to-center locator 36 mounted on alignment fixture 34 with contact edges 72 and 72' in contact with the alignment fixture edge stops (edge locator pins 46 and 46'). Then, in step 110, a calibration wafer 300 is placed by the wafer-handling system at the calibration location, for example, on tooling balls 12 of tooling arms 14 (the rest of tilt-plate assembly 10 is not shown in FIG. 10).

Figure 13:
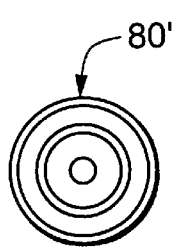
FIG. 13 is a top view of the raised bulls-eye second center marker shown in FIG. 10.

Then, in step 120, the alignment of wafer 300 with jig 30 is evaluated, such as by an operator 405 who visually looks through transparent calibration wafer 300 along arrow A to see the relationship between alignment pin 302 and center marker 80' on edge-to-center locator 36. As shown in FIG. 10 and further detailed in FIG. 13, center marker 80' is in the shape of a raised bulls-eye. Any type of visual alignment device may be used, however, when the method involves visually evaluating alignment.

The ability to move alignment pin 302 along the z-axis, orthogonal to the wafer planar surface, facilitates evaluation of the alignment by reducing parallax. That is, by moving tip 306 of alignment pin 302 closer to center marker 80', there is less distortion of the visual alignment as angle a (between the viewing axis and the wafer) decreases than would be present if alignment pin 302 were fixed further from center marker 80'. Thus, the evaluation of the wafer alignment may include extending the alignment pin along the z-axis.

In step 130, the operator 405 adjusts the robot motion as necessary, such as by moving the robot arm (not shown) so that alignment pin 302 is centered on center marker 80' to "teach" the robot the correct position. Typically, en edge-handling robot may be programmed to hold the wafer in place when it places the wafer in the calibration position, and thus may be moved until the center markers are aligned.

In step 140, steps 110, 120, and 130 are repeated until step 120 comprises wafer 300 being placed in a position that is considered to be in alignment with edge-to-center locator 36. The calibration wafer may be considered aligned when alignment pin 302 of calibration wafer 300 and the center marker 80' of edge-to-center locator 36 are aligned within a predetermined tolerance. A predetermined tolerance means a tolerance fixed by design before calibration begins.

Jig 30 is referred to as being pre-calibrated in the method above, because the jig itself needs to be calibrated only a single time upon first use. The jig itself is pre-calibrated by first mounting the uncalibrated jig to the tool at the calibration location (for example, jig 30 is affixed to tilt-plate assembly 10 as shown in FIG. 2). Then a pre-aligned wafer, which may be any standard product quality wafer typically handled by the handling system, is placed at the calibration location by the wafer-handling system (for example, wafer 32 is placed on tooling balls 12 of tilt-plate assembly 10 as shown in FIG. 2).

Figure 8:
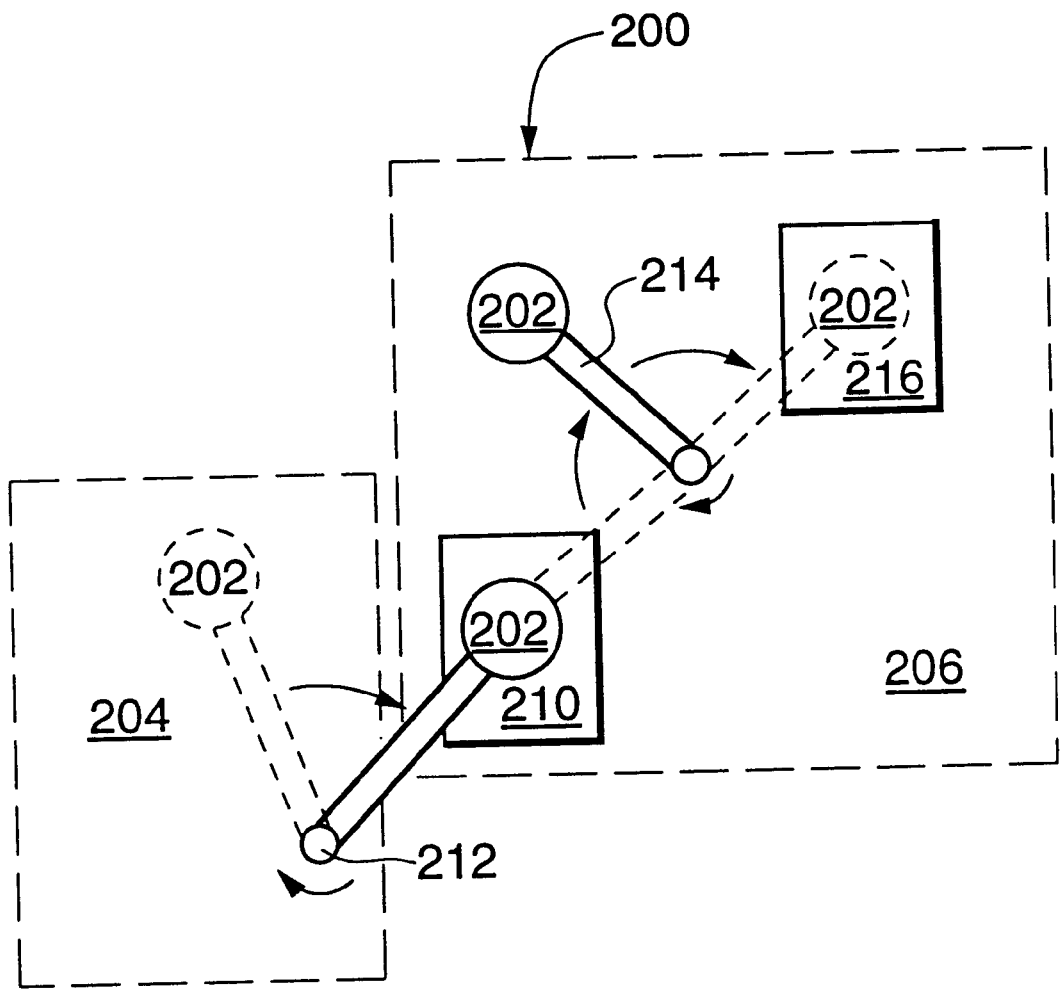
FIG. 8 is a schematic block diagram showing interfacing wafer-handling systems in an exemplary process known in the art.

Reference to the "pre-aligned" wafer above means that the wafer has been aligned to the wafer-handling system by a sequentially adjacent processing tool. The sequentially adjacent processing tool may be the tool from which the wafer-handling system normally picks up the wafer before placing it at the calibration location being calibrated, or the tool to which the wafer-handling system normally takes the wafer after picking it up from the calibration location. For example, in the lithography configuration 200 as shown in FIG. 8, wafer 202 may be handled by robot 212 of track system 204 that places wafer 202 at the pickup-dismount location 210, from which stepper robot 214 picks up wafer 202 and places it on pre-aligner 216 before wafer 202 is picked up by a flip-and-repeat arm (not shown) and taken to the exposure chuck (not shown). A wafer 202 that has been aligned by pre-aligner 216, picked up by stepper robot 214, and placed at pickup-dismount location 210 is in the correct position to which the jig 30 of the present invention can be calibrated.

Calibration of jig 30 comprises mounting jig 30 to the tool at the calibration location, adjusting the edge stops of alignment fixture 34 (such as by moving edge locator pins 46 and 46' of edge locator pin assemblies 48 and 48' by turning knob 55 as shown in FIG. 2) to a position in contact with the peripheral edge 33 of wafer 32. Edge stops (edge locator pins 46 and 46') are then fixed in that position (such as by tightening knob 47). To assure that there is no drift in the wafer-handling system used for calibrating the jig 30, a wafer placed in the calibrated jig 30 may then be picked up by that wafer-handling system and returned to the sequentially adjacent processing tool (for instance, stepper robot 214 may pick up the wafer 202 from calibrated jig 30 and place it on pre-aligner 216, which can determine if the wafer 202 is aligned). Adjustment to the calibration can be made, if necessary.

When the calibration location is merely a pickup location for one wafer handler, that handler is programmed to reverse its steps to pick up a wafer in a position where it normally delivers the wafer, and transfer it to the position where it normally picks the wafer up. Steps 100, 110, 120, 130, and 140 may comprise a completed method if only a single wafer-handling system is to be calibrated. For calibration of a wafer pickup-dismount location involving two or more wafer-handling systems, in step 150, steps 100, 110, 120, 130, and 140 are repeated for additional edge-handling wafer-handling systems. Where one wafer handler is a center-handling device and another is an edge-handling device, the edge-handling device is aligned by aligning the calibration wafer center marker with the edge-to-center locator center marker as described above, whereas the center-handling device is aligned by aligning by normal wafer edge to the alignment fixture edge stops as described below.

Where multiple wafer-handling systems are to be calibrated and at least one system is an edge-handling device and at least one is a center-handling device, such as for calibrating a pickup-dismount location where an edge-handling track robot and center-handling lithography tool robot interface, the method may further comprise steps 160, 170, 180, and 190. First, at step 160, a standard product wafer is placed at the calibration location by the center-handling wafer-handling system. The calibration wafer cannot be used with center-handling wafer handlers because the center marker is located where the handler would pick up the wafer. Alignment of the wafer with the alignment fixture is then evaluated in step 170 by evaluating the alignment of the wafer peripheral edge with the one or more edge stops. The wafer-handling system is adjusted as necessary in step 180, and the steps of placing, evaluation, and adjustment are repeated in step 190 until the wafer is placed with the wafer peripheral edge aligned with the one or more edge stops within a predetermined tolerance.

A center-handling robot typically releases vacuum on the wafer, for instance, to deliver the wafer into place onto tilt-plate assembly 10. Thus, to facilitate teaching the robot the correct position, the wafer may be positioned just above the calibration position in step 160 so that the robot sequence is stopped just before the robot delivers the wafer onto tilt-plate assembly 10. Alignment may be first roughly evaluated in this position and the robot arm "taught" to adjust the position before actually delivering the wafer onto the tilt-plate assembly. Fine adjustments may be made by allowing the robot to actually deliver the wafer into place, then evaluating alignment and finely adjusting the robot parameters accordingly.

Alignment jig 30 having one or more edge stops (edge locator pins 46 and 46') for aligning a wafer by its edge and the combination of calibration wafer 300 and edge-to-center locator 36 for aligning a wafer by its center are particularly advantageous for carrying out the above method when both center and edge handling systems must be aligned to one another. As shown in FIG. 3A, edge-to-center locator 36 mounts to alignment fixture 34 below tooling balls 12 of tilt-plate assembly 10 such that the edge-to-center locator 36 is not in the way of standard wafer 32 placed above jig 30. Thus, edge-to-center locator 36 may remain in place even during calibration of a centerhandling device that uses only the edge locator pins 46, 46' for alignment.

Figure 11:
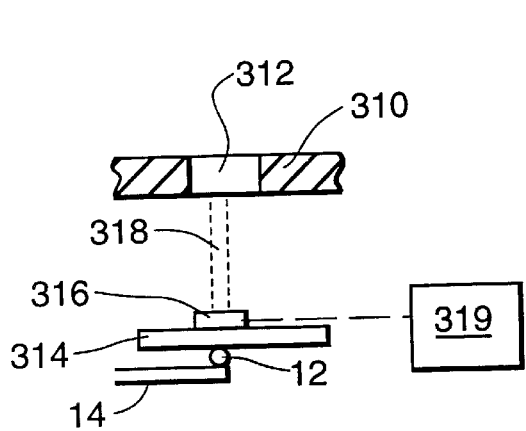
FIG. 11 is a partial side view of an exemplary alignment device of the present invention having a transmitter and a receiver as alignment devices, showing the calibration wafer in partial cross section.

Other types of calibration wafers with different types of center markers may also be used. For instance, as shown in FIG. 11, calibration wafer 310 may have a center marker that is a transmitter 312 and the edge-to-center locator 314 may have a center marker that is a receiver 316, or vice-versa, of a signal 318, such as a light beam or other form of visible or non-visible radiation. Thus, as shown in FIG. 11, alignment of the two center markers may be evaluated electronically rather than visually. Adjustment of the robot motion may even comprise automatic correction based on a signal transmitted to the robot. In such a case, receiver 316 may be connected to a wafer-handling system 319 for transmission of such a calibration signal, either by a hard wire or, for instance, by a radio wave transmitter and receiver.

As an alternative, the center marker of calibration wafer 310 may be transmitter 312 as shown in FIG. 11 that transmits a concentrated beam of visible light. The light may be used with edge-to-center locator 36 having a center marker 80' comprising cross hairs or some other visual alignment device for visual evaluation and manual adjustment of the closeness to center.

Figure 12:
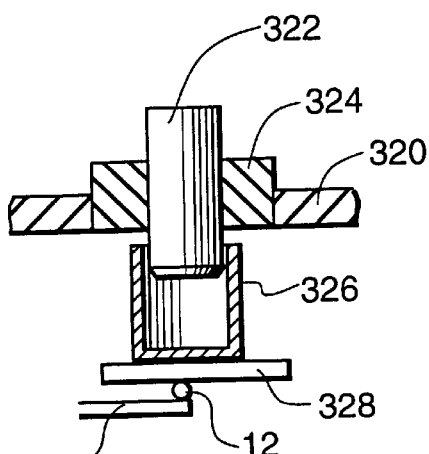
FIG. 12 is a partial side view of an exemplary alignment device of the present invention having a mechanical alignment device, showing the calibration wafer in partial cross section.

In yet another alternative, the center markers may be mechanical alignment devices such as a pin that fits within a sleeve. For instance, as shown in FIG. 12, the calibration wafer 320 may comprise a pin 322 that may be moved within a bushing 324 along the z-axis orthogonal to the x-y plane on which the wafer 320 lies, to interlock with a sleeve 326, attached to the edge-to-center locator 328 or some other portion of jig 30, when precisely aligned. In this way, the calibration tolerance may be reflected in the difference between dimensions of the pin 322 and the sleeve 326 (i.e., if cylindrical, the difference between the outside diameter of the pin 322 and the inside diameter of the sleeve 326). The sleeve 326 may be mounted to wafer 320 in bushing 324 and the pin 322 may be mounted to edge-to-center locator 328, or the bushing 324 which allows longitudinal motion may be mounted to the jig 30, if space and logistics allow.

When the center markers comprise a transmitter and receiver or when they comprise mechanical alignment devices, the calibration wafer need not be transparent. Even when the center markers comprise visual alignment devices, the entire calibration wafer need not be transparent, but instead may have only an incomplete transparent portion, such as a window, through which alignment may be visually evaluated. Under certain circumstances, it may be possible to make a visual evaluation from the side or from underneath the wafer such that the wafer need not be transparent at all, even when the center markers are visual alignment devices.

The calibration wafer, alignment system, and the methods used with those components of the present invention, although particularly useful for calibrating a wafer pickup-dismount location, are equally applicable to calibrating other calibration locations of any wafer-handling system with respect to any wafer-processing tool.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A calibration wafer for alignment of a wafer-handling system adapted to process a plurality of product wafers, said calibration wafer having (a) radial and thickness dimensions and tolerances substantially equivalent to said product wafers and (b) an edge and further comprising a center marker located at a point equidistant radially from the edge of the calibration wafer and adapted for alignment with a second marker external to said calibration wafer.

2. The calibration wafer of claim 1 wherein the wafer has at least a portion that is transparent.

3. The calibration wafer of claim 2 wherein the center marker is a visual alignment device.

4. The calibration wafer of claim 3 wherein the center marker comprises a light source adapted to transmit a light beam.

5. The calibration wafer of claim 1 wherein the center marker is one of a transmitter adapted to transmit a signal to said second marker and a receiver adapted to receive a signal from said second marker.

6. The calibration wafer of claim 5 wherein the center marker is a receiver adapted to receive a signal from said second marker and said receiver is adapted to transmit a calibration signal to a wafer-processing tool.

7. A calibration wafer for alignment of a wafer-handling system adapted to process a plurality of product wafers, said calibration wafer having radial and thickness dimensions and tolerances equivalent to said product wafers and further comprising a center marker adapted for alignment with a second marker external to said calibration wafer, wherein the center marker is a visual alignment pin.

8. The calibration wafer of claim 7 further comprising an alignment bushing in which said alignment pin is mounted, said bushing adapted to enable movement of said alignment pin relative to said bushing along a longitudinal axis of said alignment pin.

9. A wafer center alignment device for precisely aligning a wafer-handling system in a calibration location with respect to a wafer-processing tool, said wafer center alignment device comprising:

an alignment jig adapted to be repeatably mounted on said tool and having a second center marker; and a calibration wafer having a first center marker, said calibration wafer adapted to be positioned with said first center marker in alignment with said second center marker.

10. The wafer center alignment device of claim 9 wherein said alignment jig further comprises:

an alignment fixture adapted to be repeatably mounted on said tool, said fixture having at least one edge stop; and an edge-to-center locator mounted on said alignment fixture, said locator having said second center marker thereon and a peripheral edge, said second center marker positioned to mark the precise center of said calibration location when said edge-to-center locator peripheral edge is positioned in contact with said at least one alignment fixture edge stop.

11. The wafer center alignment device according to claim 10 wherein said calibration wafer first center marker and said edge-to-center locator second center marker comprise a transmitter and a receiver.

12. The wafer center alignment device according to claim 11 wherein said receiver is connected to said wafer-handling system and is adapted to transmit a calibration signal thereto.

13. The wafer center alignment device of claim 10 wherein said calibration location is a wafer pickup-dismount location of a first wafer-handling system and a wafer pickup-dismount location of a second wafer-handling system.

14. The wafer center alignment device of claim 10 wherein said wafer-processing tool comprises a tilt-plate assembly onto which said alignment fixture is adapted to be repeatably mounted.

15. The wafer center alignment device of claim 14 wherein said alignment fixture comprises a hole and a clamp mechanism, the hole having an inside edge and the clamp mechanism having two contact points, and said tilt-plate assembly comprises a post and a peripheral edge, such that with said alignment fixture mounted on said tilt-plate assembly, said post protrudes through said hole and contacts said inside edge and said clamp mechanism contact points contact said tilt-plate assembly peripheral edge.

16. The wafer center alignment device of claim 9 wherein said calibration wafer has at least a portion that is transparent.

17. The wafer center alignment device of claim 16 wherein said first and second center markers are visual alignment devices.

18. The wafer center alignment device of claim 17 wherein said calibration wafer first center marker is an alignment pin.

19. The wafer center alignment device of claim 18 wherein said calibration wafer further comprises an alignment bushing in which said alignment pin is mounted, said bushing adapted to enable movement of said alignment pin relative to said bushing along a longitudinal axis of said pin.

20. The wafer center alignment device of claim 17 wherein said second center marker comprises one of a set of cross-hairs and a bulls-eye.

21. The wafer center alignment device of claim 17 wherein said first center marker is a transmitter of a visible light beam.

22. The wafer center alignment device of claim 9 where said first and second center markers are mechanical alignment devices.

23. The wafer center alignment device of claim 22 wherein said calibration wafer further comprises an alignment bushing in which said first center marker is mounted, said bushing adapted to enable movement of said first marker relative to said bushing along a longitudinal axis perpendicular to said wafer to permit said first marker to interlock with said second marker when aligned.

24. A method of aligning a wafer-handling system in a calibration location with respect to a wafer-processing tool, the method comprising the steps of:

(a) mounting a pre-calibrated jig to said tool at said calibration location, said jig comprising a second center marker;

(b) placing a calibration wafer at said calibration location with said wafer-handling system, the calibration wafer having a first center marker;

(c) evaluating alignment of the second center marker with the first center marker;

(d) adjusting the wafer-handling system as necessary; and (e) repeating steps (b) through (d) as necessary until the wafer is placed in step (b) in a position where the second center marker and the first center marker are aligned within a predetermined tolerance.

25. The method of claim 24 wherein the jig further comprises an alignment fixture having at least one edge stop and an edge-to-center locator having a peripheral edge and comprising said second center marker, the method further comprising in step (a) mounting the alignment fixture to said tool and then positioning said edge-to-center locator peripheral edge in contact with said at least one edge stop such that said edge-to-center locator first center marker identifies the precise center of said calibration location.

26. The method of claim 25 further comprising, before step (a), pre-calibrating the jig by the steps of:

(i) mounting the alignment fixture to said tool at said calibration location;

(ii) placing a wafer at said calibration location with said wafer-handling system, said wafer having been pre-aligned to the wafer-handling system by a sequentially adjacent processing tool;

(iii) adjusting the at least one edge stop to be positioned in peripheral contact with said wafer, and (iv) fixing said at least one edge stop in such position.

27. The method of claim 25 wherein said calibration location is a wafer pickup-dismount location for more than one wafer-handling system, said method comprising performing steps (a) through (f) for at least one of said wafer-handling systems, and performing one of steps (a) through (f) or steps (g) through (j) for all other wafer-handling systems to be calibrated until all said more than one wafer-handling systems have been calibrated, steps (g) through (j) comprising:

(g) placing a wafer at or just above said calibration location with a wafer-handling system to be calibrated, the wafer having a peripheral edge;

(h) evaluating alignment of the wafer with the alignment fixture by evaluating contact of a peripheral edge of said wafer with said at least one edge stop;

(i) adjusting the wafer-handling system to be calibrated;

(j) repeating steps (g) through (i) as necessary until the wafer is placed in step (g) in a position where the wafer peripheral edge and at least one edge stop are aligned within a predetermined tolerance.

28. The method of claim 24 wherein said calibration wafer has at least a portion that is transparent and said first center marker and said second center marker are both visual alignment devices, and wherein step (c) comprises visually observing through said calibration wafer the alignment of said first and second center markers.

29. The method of claim 28 wherein said first center marker is a calibration pin and said calibration wafer comprises a planar surface having an alignment bushing centered therein in which said calibration pin is mounted, in which step (c) comprises mechanically translating said first center marker orthogonally with respect to said wafer planar surface to reduce parallax when evaluating said alignment by visual observation.

30. The method of claim 24 wherein said calibration wafer comprises a planar surface having an alignment bushing centered therein in which said first center marker is mounted, and said first center marker and said second center marker are both interlocking mechanical alignment devices, and wherein step (c) comprises mechanically translating said first center marker orthogonally with respect to said wafer planar surface to mechanically interlock said first and second center markers.

31. The method of claim 24 wherein said first center marker and said second center marker are a transmitter and receiver, and wherein step (c) comprises receiving an alignment signal by said receiver from said transmitter and transmitting a calibration signal to said wafer-handling system and step (e) comprises automatically adjusting said wafer-handling system in response to said calibration signal.

* * * * *